US011153016B2

(12) United States Patent
Marchand et al.

(10) Patent No.: US 11,153,016 B2
(45) Date of Patent: Oct. 19, 2021

(54) GALVANIC ISOLATED DEVICE AND CORRESPONDING SYSTEM

(71) Applicant: InterDigital CE Patent Holdings, SAS, Paris (FR)

(72) Inventors: Philippe Marchand, Vitre (FR); Claude Fouque, La Malhoure (FR); Frederique Salou, Vignoc (FR)

(73) Assignee: INTERDIGITAL CE PATENT HOLDINGS, SAS, Paris (FR)

( * ) Notice: Subject to any disclaimer, the term of this patent is extended or adjusted under 35 U.S.C. 154(b) by 0 days.

(21) Appl. No.: 16/652,056

(22) PCT Filed: Sep. 28, 2018

(86) PCT No.: PCT/EP2018/076419
§ 371 (c)(1),
(2) Date: Mar. 29, 2020

(87) PCT Pub. No.: WO2019/063771
PCT Pub. Date: Apr. 4, 2019

(65) Prior Publication Data
US 2020/0252137 A1    Aug. 6, 2020

(30) Foreign Application Priority Data

Sep. 29, 2017 (EP) .................................. 17306294

(51) Int. Cl.
*H04B 10/80* (2013.01)
*H03K 17/795* (2006.01)
(Continued)

(52) U.S. Cl.
CPC ....... *H04B 10/802* (2013.01); *H03K 17/7955* (2013.01); *H03K 19/14* (2013.01); *H03K 19/01759* (2013.01)

(58) Field of Classification Search
CPC .. H04B 10/802; H03K 17/7955; H03K 19/14; H03K 19/01759
(Continued)

(56) References Cited

U.S. PATENT DOCUMENTS

| 2010/0086312 A1* | 4/2010 | Keita | ................... H04B 10/802 |
| | | | 398/140 |
| 2011/0121781 A1* | 5/2011 | Burke | ....................... H02J 1/06 |
| | | | 320/110 |

(Continued)

FOREIGN PATENT DOCUMENTS

CN        201622260 U       11/2010

OTHER PUBLICATIONS

Anonymous, "LTC2850/LTC2851/LTC2852 3.3V 20Mbps RS485/RS422 Transceivers", Linear Technology, http://cds.linear.com/docs/en/datasheet/285012fe.pdf, Jun. 30, 2015, 18 pages.
(Continued)

*Primary Examiner* — Tomi Skibinski
(74) *Attorney, Agent, or Firm* — Patricia A. Verlangieri

(57) ABSTRACT

A device including an optoelectric circuit that is configured to provide galvanic isolation between a first circuit and a second circuit is disclosed. The optoelectric circuit includes at least one non-inverting buffer and a metal semiconductor diode. The at least one non-inverting buffer is positioned between a collector of a phototransistor and an anode of a light emitting diode. The metal semiconductor diode is positioned between the collector of the phototransistor and the at least one non-inverting buffer.

11 Claims, 4 Drawing Sheets

(51) Int. Cl.
*H03K 19/14* (2006.01)
*H03K 19/0175* (2006.01)

(58) Field of Classification Search
USPC .......................................................... 250/551
See application file for complete search history.

(56) References Cited

U.S. PATENT DOCUMENTS

| | | | | |
|---|---|---|---|---|
| 2014/0346987 | A1* | 11/2014 | Becker | H02P 6/085 |
| | | | | 318/400.21 |
| 2015/0381042 | A1* | 12/2015 | Mills | H04B 10/802 |
| | | | | 323/299 |
| 2020/0287539 | A1* | 9/2020 | Ma | H02M 5/458 |

OTHER PUBLICATIONS

Blozis, S., "Opto-Electrical Isolation of the 12C-Bus", www.embedded.com/design/prototyping-and-development/4025023/Opto-electrical-isolation-of-the-12C-Bus#, Oct. 14, 2004, 11 pages.

* cited by examiner

GALVANIC ISOLATED DEVICE AND CORRESPONDING SYSTEM

This application claims the benefit, under 35 U.S.C. § 365 of International Application PCT/EP2018/076419, filed on Sep. 28, 2018, which was published in accordance with PCT Article 21(2) on Apr. 4, 2019, in English, and which claims the benefit of European Patent Application No. 17306294.4 filed Sep. 29, 2017.

FIELD

The present disclosure is directed to a device and system for providing bidirectional data communication between one or more devices and to a method for providing bidirectional data communication between one or more devices.

BACKGROUND

This section is intended to introduce the reader to various aspects of art, which may be related to embodiments that are described below. This discussion is believed to be helpful in providing the reader with background information to facilitate a better understanding of the various aspects of the present disclosure. Accordingly, it should be understood, that these statements are to be read in this light.

Communication buses are widely known for transferring data/electric signals from one device to another or to multiple devices. Such a communication bus can be used for example to transmit configuration data from a system controller to a power supply or to receive monitoring data from the power supply itself. The communication bus can also be used to implement a communication channel within the power supply itself, for example to configure or monitor different outputs of the power supply.

One example of a communication bus is an Inter-Integrated Circuit ($I^2C$). The $I^2C$ is typically used for attaching lower-speed peripheral ICs to processors and microcontrollers in short-distance, intra-board communication.

For some $I^2C$ applications, galvanic isolation is needed. Galvanic isolation is used where two or more electric circuits must communicate, but their grounds may be at different potentials. Galvanic isolation isolates functional sections of electrical systems to prevent current flow, such that no direct conduction path is permitted. However, energy or information may still be exchanged between the sections by, for example, capacitance, induction or electromagnetic waves or by optical, acoustic or mechanical signals.

FIG. 1 shows an example of Galvanic isolation for the $I^2C$ using optical isolation. In FIG. 1, optical couplers $3a$, $3b$ provide galvanic isolation for $I^2C$ bus $7a$, $7b$ signals. Additionally, an expensive bidirectional bus buffer 5 is required to prevent latching (signal blocking) of the optical couplers $3a$, $3b$.

Thus, a need exists to provide a simple low-cost solution for galvanic isolation.

SUMMARY

The present disclosure concerns a communication bus with galvanic isolation. It will be understood that the proposed apparatus or method is not limited to any specific type of communication bus and may be applied to any communication bus, such as for example an Inter-Integrated Circuit ($I^2C$).

According to a first aspect of the disclosure, there is provided a device comprising an optoelectric circuit that is configured to provide galvanic isolation between a first circuit and a second circuit. The optoelectric circuit includes at least one non-inverting buffer and a metal semiconductor diode. The at least one non-inverting buffer is positioned between a collector of a phototransistor and an anode of a light emitting diode. The metal semiconductor diode is positioned between the collector of the phototransistor and the at least one non-inverting buffer.

In an embodiment, at least three non-inverting buffers are positioned between the collector of the phototransistor and the anode of the light emitting diode.

According to a second aspect of the disclosure, a system is described including a first circuit, a second circuit and an optoelectric circuit configured to provide galvanic isolation between the first circuit and the second circuit. The optoelectric circuit includes at least one non-inverting buffer and a metal semiconductor diode. The at least one non-inverting buffer is positioned between a collector of a phototransistor and an anode of a light emitting diode. The metal semiconductor diode is positioned between the collector of the phototransistor and the at least one non-inverting buffer.

In an embodiment, at least one of the first circuit and the second circuit is an Inter-Integrated Circuit ($I^2C$).

In an embodiment, at least one of the first circuit and the second circuit is coupled to a high-voltage AC power supply.

According to a third aspect of the disclosure, a method is described for providing galvanic isolation between a first circuit and a second circuit using an optoelectric circuit. The optoelectric circuit receives a signal from the first circuit and then transmits the received signal to a second circuit. The optoelectric circuit includes at least one non-inverting buffer and a metal semiconductor diode. The at least one non-inverting buffer is positioned between a collector of a phototransistor and an anode of a light emitting diode. The metal semiconductor diode is positioned between the collector of the phototransistor and the at least one non-inverting buffer.

In an embodiment, at least three non-inverting buffers are positioned between a collector of a phototransistor and an anode of a light emitting diode.

In an embodiment, at least one of the first circuit and the second circuit is an Inter-Integrated Circuit ($I^2C$).

Some processes implemented by elements of the disclosure may be computer implemented. Accordingly, such elements may take the form of an entirely hardware embodiment, an entirely software embodiment (including firmware, resident software, micro-code, etc.) or an embodiment combining software and hardware aspects that may all generally be referred to herein as "circuit", "module" or system. Furthermore, such elements may take the form of a computer program product embodied in any tangible medium of expression having computer usable program code embodied in the medium.

Since elements of the present disclosure can be implemented in software, the present disclosure can be embodied as computer readable code for provision to a programmable apparatus on any suitable carrier medium. A tangible carrier medium may comprise a storage medium such as a floppy disk, a CD-ROM, a hard disk drive, a magnetic tape device or a solid-state memory device and the like. A transient carrier medium may include a signal such as an, an electrical signal, an optical signal, an acoustic signal, a magnetic signal or an electromagnetic signal, e.g. a microwave or RF signal.

BRIEF DESCRIPTION OF THE DRAWINGS

Embodiments of the disclosure will now be described, by way of example only, and with reference to the following drawings in which.

It should be understood that the drawings are for purposes of illustrating the concepts of the disclosure and is not necessarily the only possible configuration for illustrating the disclosure.

DETAILED DESCRIPTION

Galvanic isolation may be achieved using optical isolation. For example, an optical isolator may transmit electrical signals between two isolated circuits using light. Optical isolators prevent high voltages from affecting the system receiving such signals.

A common type of optical isolator includes a light emitting diode (LED) and a phototransistor combination. Other exemplary source-sensor combinations may include LED-photodiode, LED-LASCR (Light Activated Silicon Controlled Rectifier) and lamp-photoresistor pairs. Typically, optical isolators transfer digital (on-off) signals, but analog signals may also be used in some instances.

Figure 1:
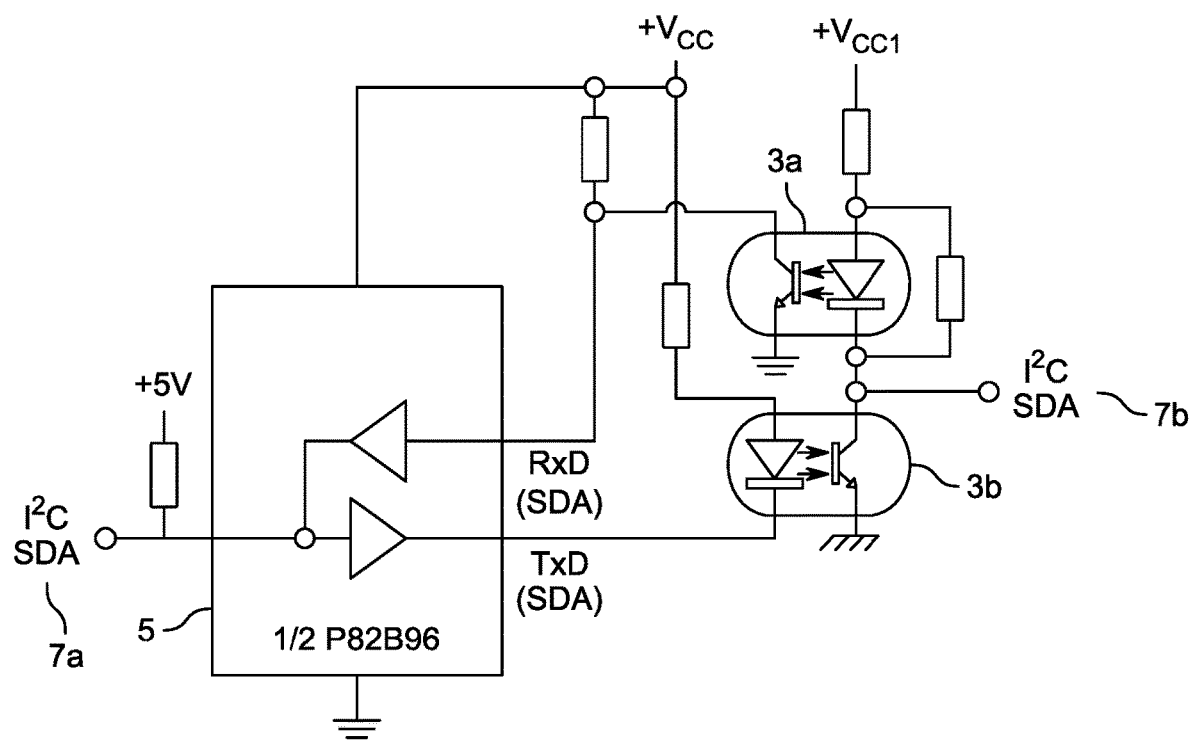
FIG. 1 illustrates a prior art galvanic isolation circuit.
Figure 2:
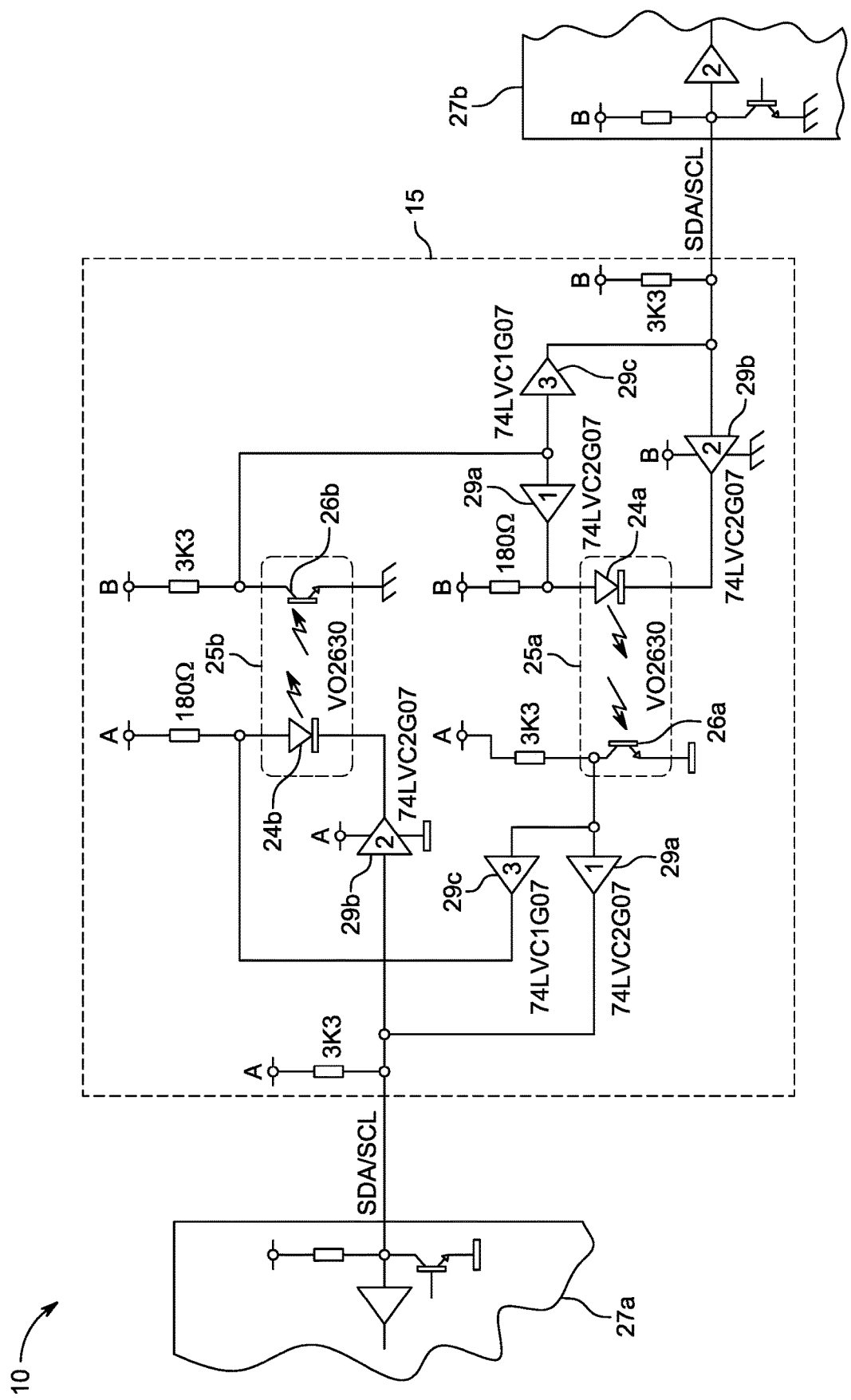
FIG. 2 is an illustration of an exemplary bi-directional data communication device according to an embodiment of the disclosure.

FIG. 2 illustrates an exemplary bi-directional data communication system 10 in accordance with an embodiment of the present disclosure. System 10 includes communication buses 27a, 27b, which may be for example I²C circuits. Coupled between communication buses 27a, 27b is an optoelectric circuit 15.

Optoelectric circuit 15 includes optical isolators 25a, 25b which are used to transmit signals between the communication buses 27a, 27b. The optical isolators 25a, 25b include a phototransistor 26a, 26b and a light emitting diode 24a, 24b. A non-latching solution is provided by including non-inverting buffers 29a, 29b, 29c between the collector of the phototransistor 26a, 26b and the anode of the light emitting diode 24a, 24b.

The non-inverting buffers 29a, 29b, 29c allow the phototransistor 26a to go to a low logic level, but does not cause the light emitting diode 24b to emit light. Thus, optoelectric circuit 15 is a non-latching type. In one embodiment, non-inverting buffers 29a, 29b are positioned in series, while non-inverting buffer 29c is positioned parallel to non-inverting buffers 29a, 29b.

Figure 3:
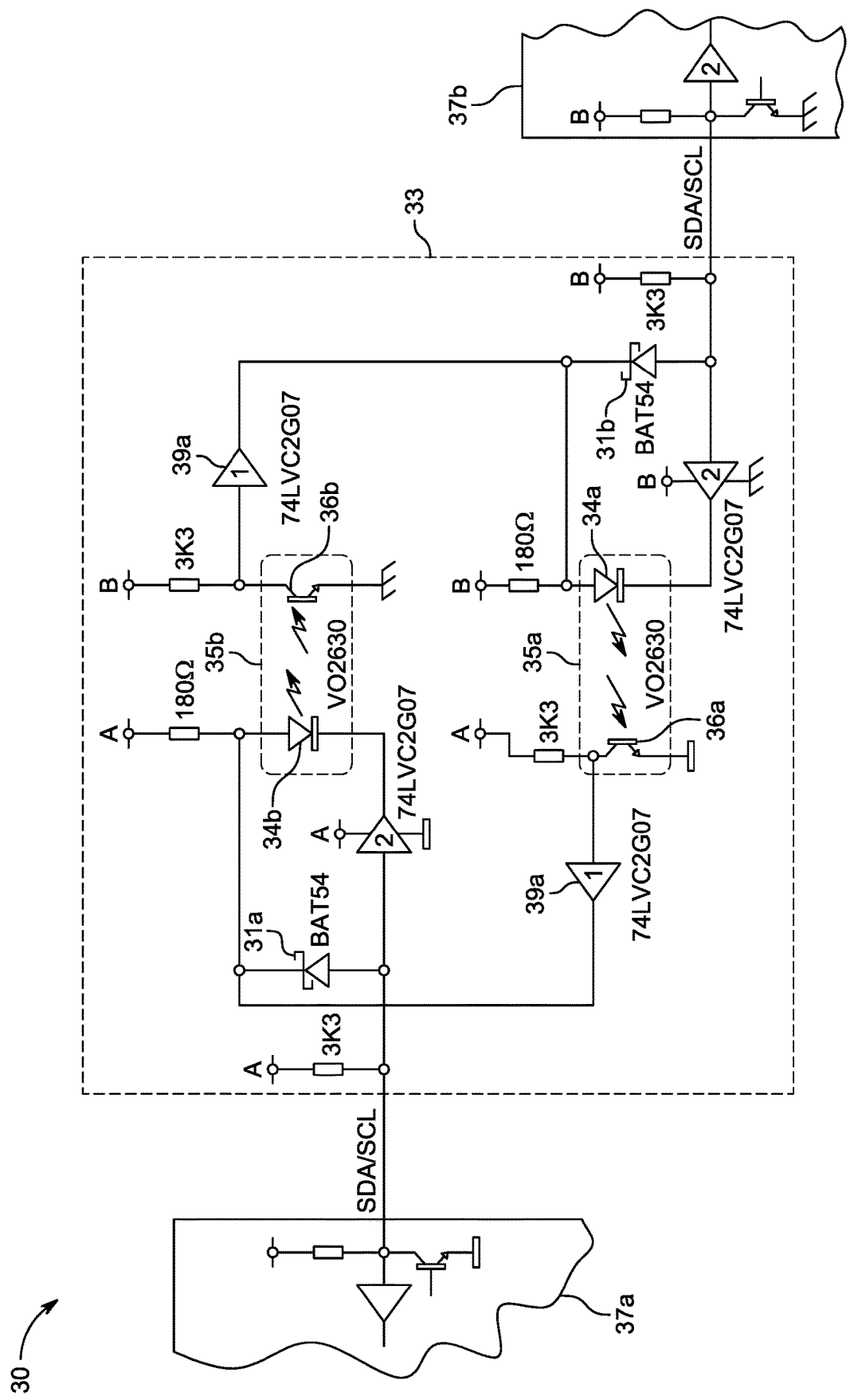
FIG. 3 is an illustration of an exemplary bi-directional data communication device according to another embodiment of the disclosure.

FIG. 3 illustrates an exemplary bi-directional data communication system 30 in accordance with another aspect of the present disclosure. System 30 includes communication buses 37a, 37b, which may be for example I²C circuits. Coupled between communication buses 37a, 37b is an optoelectric circuit 33.

Optoelectric circuit 33 includes optical isolators 35a, 35b which are used to transmit signals between the communication buses 37a, 37b. The optical isolators 35a, 35b include a phototransistor 36a, 36b and a light emitting diode 34a, 34b. A non-latching solution is provided by including at least one non-inverting buffer 39a and a metal-semiconductor diode 31a, 31b between the collector of the phototransistor 36a, 36b and the anode of the light emitting diode 34a, 34b.

The addition of the metal semiconductor diode 31a, 31b and at least one non-inverting buffer 29a allows the collector of the phototransistor 36a to go to a low logic level, but does not cause the light emitting diode 34b to emit light. This is because the metal semiconductor diode 31a causes light emitting diode 34b to short circuit. Thus, optoelectric circuit 33 is a non-latching type.

Figure 4:
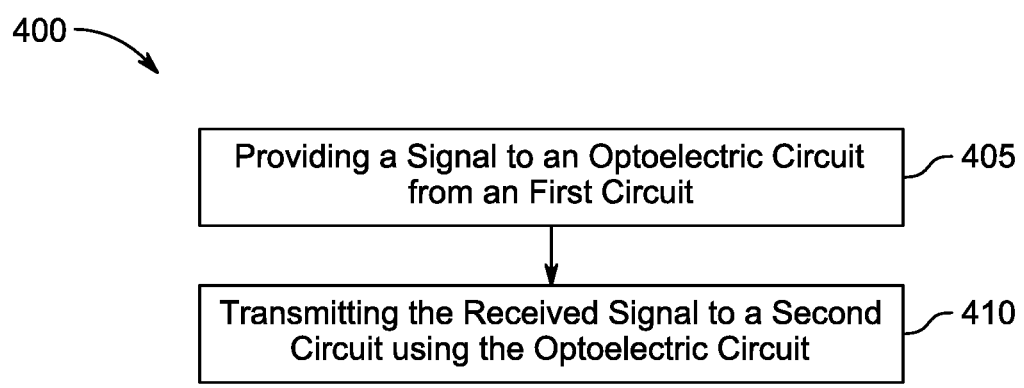
FIG. 4 illustrates a flowchart of an exemplary method in accordance with one embodiment of the disclosure.

FIG. 4 illustrates a flowchart of an exemplary method 400 in accordance with another aspect of the disclosure. In step 405, a signal is provided to an optelectric circuit from a first circuit. The optoelectric circuit may receive digital (on-off) signals, but analog signals may also be used. The first circuit may include a communication bus, which may be for example, an I²C circuit.

The signal received from the first circuit is then transmitted to a second circuit via the optoelectric circuit, as depicted in step 410. The optoelectric circuit uses galvanic isolation to transmit the received signal to the second circuit using optical transmitter-sensor pairs, such as for example, light emitting diode (LED)-phototransistor, LED-photodiode, LED-LASCR (Light Activated Silicon Controlled Rectifier) and lamp-photoresistor pairs.

The second circuit may include a communication bus, which may be for example, an JC circuit. Additionally, at least one of the first circuit and the second circuit may be coupled to a high voltage AC power supply.

It should be understood that the elements shown in the figures may be implemented in various forms of hardware, software or combinations thereof. Preferably, these elements are implemented in a combination of hardware and software on one or more appropriately programmed general-purpose devices, which may include a processor, memory and input/output interfaces. Herein the phrase "coupled" is defined to mean directly connected to or indirectly connected with, through one or more intermediate components. Such intermediate components may include both hardware and software based components.

The present description illustrates the principles of the present disclosure. It will thus be appreciated that those skilled in the art will be able to devise various arrangements that, although not explicitly described or shown herein, embody the principles of the disclosure and are included within its scope.

All examples and conditional language recited herein are intended for educational purposes to aid the reader in understanding the principles of the disclosure and the concepts contributed by the inventors to furthering the art, and are to be construed as being without limitation to such specifically recited examples and conditions.

Moreover, all statements herein reciting principles, aspects, and embodiments of the disclosure, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that the diagrams presented herein represent conceptual views of illustrative circuitry embodying the principles of the disclosure. Similarly, it will be appreciated that any flow charts, flow diagrams, state transition diagrams, pseudocode and the like represent various processes which may be substantially represented in computer readable media and so executed by a computer or processor, whether or not such computer or processor is explicitly shown.

The functions of the various elements shown in the figures may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, read only memory (ROM) for storing software, random access memory (RAM), and nonvolatile storage.

Other hardware, conventional and/or custom, may also be included. Similarly, any switches shown in the figures are conceptual only. Their function may be carried out through the operation of program logic, through dedicated logic, through the interaction of program control and dedicated logic, or even manually, the particular technique being selectable by the implementer as more specifically understood from the context.

In the claims, hereof, any element expressed as a means for performing a specified function is intended to encompass any way of performing that function including, for example, a) a combination of circuit elements that performs that function or b) software in any form, including, therefore, firmware, microcode or the like, combined with appropriate circuitry for executing that software to perform the function. The disclosure as defined by such claims resides in the fact that the functionalities provided by the various recited means are combined and brought together in the manner which the claims call for. It is thus regarded that any means that can provide those functionalities are equivalent to those shown herein.

The invention claimed is:

1. A device, comprising:
   an optoelectric circuit configured to provide galvanic isolation between a first circuit and a second circuit, wherein the optoelectric circuit includes:
   at least one non-inverting buffer positioned between a collector of a phototransistor and an anode of a light emitting diode, and
   a metal semiconductor diode positioned between the collector of the phototransistor and the at least one non-inverting buffer.

2. The device of claim 1, wherein at least three non-inverting buffers are positioned between the collector of the phototransistor and the anode of the light emitting diode.

3. A system, comprising:
   a first circuit and a second circuit; and
   an optoelectric circuit configured to provide galvanic isolation between the first circuit and the second cirrcuit according to claim 1.

4. The device according to claim 1, wherein at least one of the first circuit and the second circuit is an Inter-integrated circuit.

5. The device according to claim 1, wherein at least one of the first circuit and the second circuit is coupled to a high-voltage AC power supply.

6. The system according to claim 3, wherein at least one of the first circuit and the second circuit is an Inter-integrated circuit.

7. The system according to claim 3, wherein at least one of the first circuit and the second circuit is coupled to a high-voltage AC power supply.

8. A method, comprising:
   providing a signal to an optoelectric circuit from a first circuit;
   transmitting the signal to a second circuit using the optoelectric circuit;
   wherein the optoelectric circuit includes:
   at least one non-inverting buffer positioned between a collector of a phototransistor and an anode of a light emitting diode, and
   a metal semiconductor diode positioned between the collector of the phototransistor and the at least one non-inverting buffer.

9. The method of claim 8, wherein at least three non-inverting buffers are positioned between the collector of the phototransistor and the anode of the light emitting diode.

10. The method of claim 8, wherein at least one of the first circuit and the second circuit is and Inter-integrated circuit.

11. A computer program product for a programmable apparatus, the computer program product comprising a sequence of instructions for implementing a method according to claim 8, when loaded into and executed by the programmable apparatus.

* * * * *